United States Patent [19]

Beyersdorf

[11] 4,037,220

[45] July 19, 1977

[54] CIRCUIT ARRANGEMENT FOR MONITORING INTERRUPTIONS IN TWO CLOSED-CIRCUIT LOOPS

[76] Inventor: Hartwig Beyersdorf, Konsulweg 29, Scharbeutz, Germany, D-2409

[21] Appl. No.: 620,276

[22] Filed: Oct. 7, 1975

[30] Foreign Application Priority Data

Oct. 31, 1974 Germany ............................ 2451907

[51] Int. Cl.[2] ........................ G01D 4/10; G01R 31/02

[52] U.S. Cl. ....................................... 340/256; 324/51

[58] Field of Search ................... 235/151.31, 153 AE; 324/51, 57 R, 62, 64; 307/96, 97, 125, 126, 132 R; 328/76, 143, 271; 340/146.1 BE, 248 R, 248 F, 253 R, 253 B, 256

[56] References Cited

U.S. PATENT DOCUMENTS

| | | | |
|---|---|---|---|
| 3,032,708 | 5/1962 | Wise | 324/51 |
| 3,354,389 | 11/1967 | Hordosi | 324/51 |
| 3,594,635 | 7/1971 | Minamii et al. | 324/51 |
| 3,920,973 | 11/1975 | Avellar et al. | 235/151.31 |

OTHER PUBLICATIONS

Formica G; Cable Tester; IBM Technical Disclosure Bulletin; vol. 16, No. 12, May 1974.

Coleman et al; Cable Continuity Checker; IBM Technical Disclosure Bulletin; vol. 15, No. 1; June 1972.

*Primary Examiner*—Malcolm A. Morrison
*Assistant Examiner*—Errol A. Krass
*Attorney, Agent, or Firm*—Otto John Munz

[57] ABSTRACT

A circuit arrangement for monitoring interruptions in each of two closed-circuit loops, which loops are laid in at least one cable. One end of each loop is connected, with the optional interposition of circuit elements, to one pole of a voltage source, the other end of each loop being connected, via a resistance network, to the other pole of the voltage source. Potentials derived from points in the resistance networks are used to directly control an electronic switching element which changes its conductivity state in the event of any interruption in at least one loop. Interruptions in the respective loops lead to a corresponding rise or fall in potential of the respective network whereby the electronic switching element is actuated. In a preferred embodiment, the resistance networks are rated so that with an interruption in one of the loops, the control voltage applied to the switching element is approximately zero, the switching element is a field-effect transistor of the self-conducting type, and the conductive state of that field-effect transistor serves additionally to monitor the loops in respect of short-circuiting.

38 Claims, 15 Drawing Figures

Fig.1
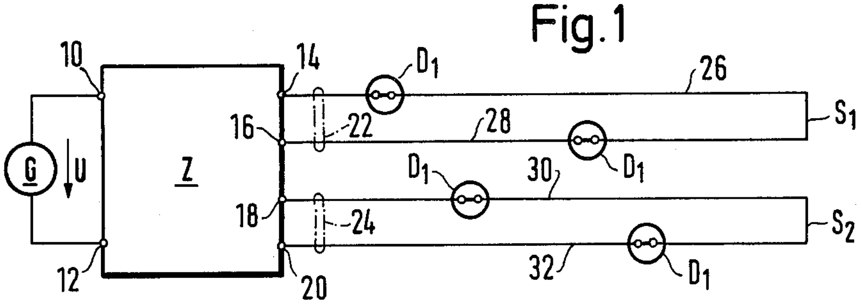
Fig.2
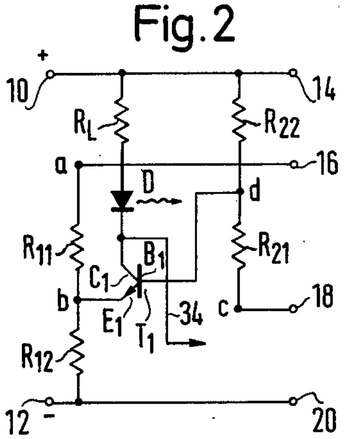
Fig.2A
| $R_{11} = R_{12}$ , $R_{21} = R_{22}$ | | | | | |
|---|---|---|---|---|---|
| | $U_a = U$ $U_c = 0$ | $U_a \neq U$ | $U_c \neq 0$ | $U_a \neq U$, $U_c \neq 0$ | $U_a = U_c$ |
| $U_a / U$ | 1 | 0 | 1 | 0 | 0 |
| $U_b / U$ | 0,5 | 0 | 0,5 | 0 | 0 |
| $U_c / U$ | 0 | 0 | 1 | 1 | 0 |
| $U_d / U$ | 0,5 | 0,5 | 1 | 1 | 0 |
| $U_{db} / U$ | 0 | 0,5 | 0,5 | 1 | 0 |
Fig.2B
| $R_{11} = 0{,}9\, R_{12}$ , $R_{21} = 0{,}9\, R_{22}$ | | | | | |
|---|---|---|---|---|---|
| | $U_a = U$ $U_c = 0$ | $U_a \neq U$ | $U_c \neq 0$ | $U_a \neq U$, $U_c \neq 0$ | $U_a = U_c$ |
| $U_a / U$ | 1 | 0 | 1 | 0 | 0 |
| $U_b / U$ | 0,53 | 0 | 0,53 | 0 | 0 |
| $U_c / U$ | 0 | 0 | 1 | 1 | 0 |
| $U_d / U$ | 0,47 | 0,47 | 1 | 1 | 0 |
| $U_{db} / U$ | -0,05 | 0,47 | 0,47 | 1 | 0 |
Fig.3
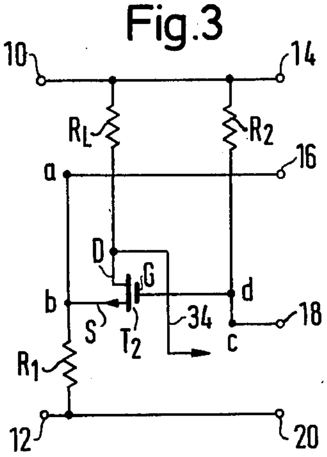
Fig.3A
| $R_1 < R_2$ | | | | | |
|---|---|---|---|---|---|
| | $U_a = U$ $U_c = 0$ | $U_a \neq U$ | $U_c \neq 0$ | $U_a \neq U$, $U_c \neq 0$ | $U_a = U_c$ |
| $U_a / U$ | 1 | 0 | 1 | 0 | 0 |
| $U_b / U$ | 1 | 0 | 1 | 0 | 0 |
| $U_c / U$ | 0 | 0 | 1 | 1 | 0 |
| $U_d / U$ | 0 | 0 | 1 | 1 | 0 |
| $U_{db} / U$ | -1 | 0 | 0 | 1 | 0 |

Fig. 4
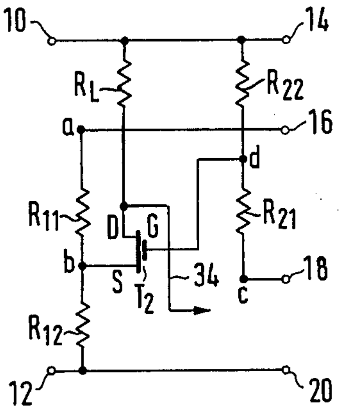
Fig. 4A
| $R_{12} = 9 R_{11}$ , $R_{22} = 9 R_{21}$ | | | | | |
|---|---|---|---|---|---|
| | $U_a = U$, $U_c = 0$ | $U_a \neq U$ | $U_c \neq 0$ | $U_a \neq U$, $U_c \neq 0$ | $U_a = U_c$ |
| $U_a/U$ | 1 | 0 | 1 | 0 | 0 |
| $U_b/U$ | 0,9 | 0 | 0,9 | 0 | 0 |
| $U_c/U$ | 0 | 0 | 1 | 1 | 0 |
| $U_d/U$ | 0,1 | 0,1 | 1 | 1 | 0 |
| $U_{db}/U$ | -0,8 | 0,1 | 0,1 | 1 | 0 |
Fig. 5
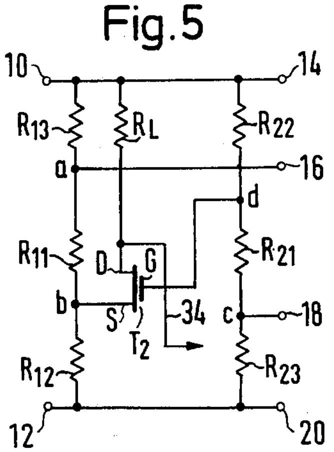
Fig. 5A
| $R_{11}$=47 kΩ, $R_{12}$=$R_{13}$=220kΩ, $R_{21}$=$R_{22}$=1MΩ, $R_{23}$=3,3MΩ | | | | | |
|---|---|---|---|---|---|
| | $U_a = U$, $U_c = 0$ | $U_a \neq U$ | $U_c \neq 0$ | $U_a \neq U$, $U_c \neq 0$ | $U_a = U_c$ |
| $U_a/U$ | 1 | 0,55 | 1 | 0,55 | 0 |
| $U_b/U$ | 0,82 | 0,45 | 0,82 | 0,45 | 0 |
| $U_c/U$ | 0 | 0 | 0,62 | 0,62 | 0 |
| $U_d/U$ | 0,5 | 0,5 | 0,81 | 0,81 | 0 |
| $U_{db}/U$ | -0,32 | 0,05 | 0,01 | 0,36 | 0 |
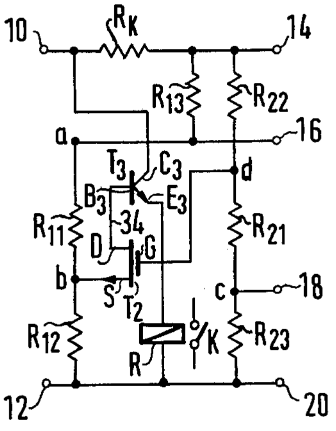
Fig. 6

CIRCUIT ARRANGEMENT FOR MONITORING INTERRUPTIONS IN TWO CLOSED-CIRCUIT LOOPS

BACKGROUND OF THE INVENTION

The prior foreign art (German Offenlegungsschrift No. 2,056,733) describes a circuit arrangement for monitoring interruptions in each of two closed-circuit loops, which loops are laid in at least one cable, i.e. in one common cable, or in respective cables, wherein one end of each loop is connected, with the optional interposition of circuit elements, to one pole of a voltage source, the other end of each loop being connected, via a resistance network, to the other pole of the voltage source; potentials derived from points in the resistance networks being used to control an electronic switching element which changes its conductivity state in the event of an interruption in at least one loop.

In the aforementioned circuit arrangement, a direct voltage is used and an interruption in one loop leads to a rise in potential at a point in the associated resistance network, while an interruption in the other loop leads to a decrease in potential at a point in the other resistance network. In order for the increase and decrease of potential in each case to lead to an identical variation in the conductivity state of the same electronic switching element, in one case the directional sense of the change of potential is reversed by an interposed transistor acting as reversing amplifier, and the potentials derived from points in the two resistance networks, which serve as control signals, are decoupled by diodes and are fed to the common electronic switching element. The transistor which serves as a reversing amplifier and the decoupling diodes entail corresponding constructional expense.

SUMMARY OF THE INVENTION

It is an object of this invention to produce the subject circuit arrangement of the greatest possible simplicity.

According to the invention, the electronic switching element is connected to provide a control signal path between points in said resistance networks from which said control potentials are derived.

In the circuit arrangement of the invention, only one electronic switching element is required. When a direct current supply is used, and an interruption in one loop leads to a fall of potential of the corresponding resistance network or an interruption in the other loop leads to a rise in potential of the corresponding resistance network, the main electrode of the electronic switching element is, in the first case, made more negative than the control electrode and, in the second case, the control electrode is made more positive than the main electrode. Thus, in every case an identical variation of control voltage and consequently an identical variation of the conductivity state of the electronic switching element can be achieved.

BRIEF DESCRIPTION OF THE DRAWINGS

FIG. 1 shows a circuit arrangement for monitoring two closed-circuit loops,

FIGS. 2, 3, 4, 5, and 6 show central stations adapted to be used in the circuit arrangement shown in FIG. 1.

FIGS. 2A, 3A, 4A, and 5A show tables of values explaining the changes of potential occurring in the central stations shown in FIGS. 2, 3, 4, and 5 or 6;

DESCRIPTION OF THE PREFERRED EMBODIMENTS

Figure 7:
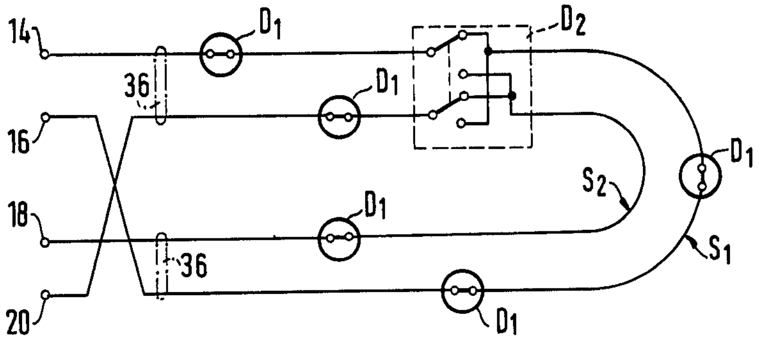
FIGS. 7 to 10 show arrangements of closed-circuit loops for alternative use in the circuit arrangement shown in FIG. 1.

In FIG. 1, a central station Z is fed by a voltage source G connected to terminals 10, 12. A first loop $S_1$ is connected to terminals 14, 16 and a second loop $S_2$ to terminals 18, 20 of the central station Z. Each of the loops $S_1$, $S_2$ is formed by two conductors 26, 28 and 30, 32 respectively of cables 22, 24, these conductors being connected together at the end of the respective cable 22 or 24, and the loops $S_1$, $S_2$ contain detectors $D_1$, which are used for example for burglary or fire-alarm purposes and which contain a normally closed contact which is opened when the alarm is given. In the central station Z therefore the response of one of the detectors $D_1$ can be monitored as well as the breakage of a wire in the loops $S_1$, $S_2$.

FIG. 2 shows the circuit construction of the central station Z (FIG. 1). Since the terminals 10, 14 are connected together, the upper end (in FIG. 1) of the loop $S_1$ is connected directly to one pole of the voltage source G. The other end of the loop $S_1$ (the lower end in FIG. 1) is connected by way of the terminal 16 and a circuit point *a,* and also by way of the resistance circuit formed by serially connecting two resistors $R_{11}$, $R_{12}$, to the terminals 12, 20 which are connected together. In similar manner the end of the loop $S_2$ which is at the bottom in FIG. 1 is connected by way of the previously mentioned terminals 20, 12 to one pole of the voltage source G, while the end of the loop $S_2$ which is at the top in FIG. 1 is connected by way of the terminal 18, a circuit point *c* and a resistance circuit, consisting of serially connected resistors $R_{21}$, $R_{22}$, to the terminals 10, 14. The common connection points of the serially connected resistors $R_{11}$, $R_{12}$ and $R_{21}$, $R_{22}$ respectively form in each case those circuit points *b, d,* at which the potential controlling the conductivity state of an electronic switching element is taken off.

Although in principle a large number of known electronic switching elements can be used, the use of transistors is particularly convenient. Thus, in the example of embodiment shown in FIG. 2, a PNP transistor $T_1$ is used. The control electrode of this transistor, the base $B_1$, is connected to the circuit point *d* of the resistance circuit associated with the loop $S_2$, while its main electrode lying in the controlled system, the emitter $E_1$, is connected to the circuit point *b* of the resistance circuit associated with the loop $S_1$. Thus, its controlled system is inserted directly between the circuit points *d, b.* The main electrode, the collector $C_1$, which does not lie in the controlled system, is connected by way of a load resistance to the terminal 10, this load resistance being formed by serially connecting an ohmic resistor $R_L$ and a light emitting diode D.

In FIG. 2A the potentials of the circuit points *a, b, c, d,* are expressed as voltages $U_a$, $U_b$, $U_c$, $U_d$ in relation to the terminal 12 and are shown referred to the voltage U of the voltage source G, which is in the form of a direct current source, for various operating states. It is here assumed that the central station Z has a circuit construction of the kind shown in FIG. 2, and that the resistance values of the resistors $R_{11}$, $R_{12}$ of the resistance circuit associated with the loop $S_1$ and the resistance values of the resistors $R_{21}$, $R_{22}$ of the resistance circuit associated with the loop $S_2$ are in each case equal to one another.

In the column headed "$U_a = U$, $U_c = 0$" in FIG. 2A are shown the voltage values which occur in the state of rest, that is to say when the loops $S_1$, $S_2$ are not interrupted. Ignoring the voltage drops along the loop $S_1$, $S_2$, the voltage $U_a$ of the circuit point *a* is here obligatorily kept by the loop $S_1$ at the voltage U whch prevails at the end of the loop $S_1$ which is connected via the terminals 14, 10 to the positive pole of the voltage source G. Similarly, the voltage $U_c$ at the circuit point *c* is kept by the loop $S_2$ at zero in relation to the negative pole of the voltage source G. Because of the equality of the resistors $R_{11}$, $R_{12}$, half the voltage U prevails at the circuit point *b* and also at the circuit point *d*, the point of connection of the resistors $R_{21}$, $R_{22}$. Thus the voltage $U_{db}$ prevailing between the circuit points *d, b,* the control voltage of the transistor $T_1$, is equal to zero in the state of rest and the transistor $T_1$ is non-conductive. Consequently no current flows through the resistor $R_L$ and the diode D, so that the latter does not light up. The voltage U occurring at the collector $C_1$ of the transistor $T_1$ can be fed by way of a connected conductor 34 to an indicator or alarm device following in the circuit, this device indicating the state of rest or being out of operation when the voltage occurs and producing a correspondingly altered indication or an alarm signal when the voltage falls in relation to the state of rest.

The column headed "$U_a \neq U$" in FIGS. 2A applies to the case where the loop $S_1$ is interrupted, so that the voltage $U_a$ at the circuit point *a* is no longer obligatorily kept at the voltage U of the voltage source G. In the embodiment shown in FIG. 2 the voltages $U_a$, $U_b$ at the circuit points *a, b* then fall at least approximately to zero value, while the voltages $U_c$, $U_d$ remain unchanged. This produces a control voltage $U_{db}$ of half the feed voltage U, so that the transistor $T_1$ becomes conductive, the diode D lights up, and any indicating or alarm device following in the circuit is correspondingly operated.

The column headed "$U_c \neq 0$" relates to the case where the loop $S_2$ is interrupted. The voltages $U_c$, $U_d$ then rise at least approximately to the full feed voltage U, while the voltage ratios in the reference circuit comprising the resistors $R_{11}$, $R_{12}$ and associated with the loop $S_1$ remain unchanged. This results in this case also in a control voltage $U_{db}$ of half the feed voltage U. An indication and/or alarm signal is then given in exactly the same way as in the previously considered case of an interruption of the loop $S_1$ only.

The voltage ratios in cases where both the loops $S_1$ and $S_2$ are interrupted are given in another column, which is headed "$U_a \neq U$, $U_c \neq 0$". Here a control voltage $U_{db}$ is obtained which is equal to the feed voltage U, so that the transistor $T_1$ becomes conductive again and an indication and/or alarm signal is given in the same manner as before.

In a last column in FIG. 2A, headed "$U_a = U_c$" are shown the voltage ratios in the event of a shortcircuit. Since in the arrangement shown in FIG. 2 and with the resistance ratios indicated in the top line in FIG. 2A the control voltage $U_{db} = 0$ prevails in the event of a short-circuit in the same manner as in the state of rest, monitoring for short-circuit is not possible with the means illustrated.

The tables in FIGS. 2B, 3A, 4A, and 5A are similarly arranged to that in FIG. 2A. Like FIG. 2A, FIG. 2B relates to the arrangement of the central station Z (FIG. 1) in accordance with FIG. 2, the table in FIG. 3A to the arrangement shown in FIG. 3, the table in FIG. 4A to the arrangement shown in FIG. 4, and the table in FIG. 5A to the arrangements according to FIGS. 5 and 6.

Some electronic switching elements are not completely non-conductive with a control voltage of 0 or are undesirably made perceptibly conductive by variations from a zero control voltage resulting from disturbing influences. For these cases it may be convenient for the resistance circuits to be so dimensioned that when the loops $S_1$ and $S_2$ are not interrupted the control voltage applied to the controlled system of the electronic switching element has a low negative value. This can be achieved in the embodiment shown in FIG. 2 by making the resistance $R_{12}$ greater than the resistance $R_{11}$ and/or making the resistance $R_{22}$ greater than the resistance $R_{21}$ connected in series with it. In this arrangement the ratio between the resistance value of the resistor $R_{11}$, $R_{21}$ connected to the end of a loop $S_1$, $S_2$ remote from the voltage source G to that of the resistor $R_{12}$, $R_{22}$ connected to the voltage source G is expediently at least approximately equal in both series circuits.

FIG. 2B shows the voltage ratio when the resistors $R_{11}$, $R_{12}$, $R_{21}$, and $R_{22}$ are rated on the basis of the above considerations, in such a manner that $R_{11} = 0.9\ R_{12}$ and $R_{21} = 0.9\ R_{22}$. Here a slightly negative control voltage $U_{db}$ is obtained in the state of rest; on the interruption of a loop $S_1$ or $S_2$ a control voltage is obtained which is slightly lower than that shown in the table in FIG. 2A but which is adequate; and on the interruption of both loops $S_1$ and $S_2$ and in the event of short-circuit the same consequences as in the table shown in FIG. 2A are obtained.

A further development of the circuit arrangement seeks also to permit monitoring of the two loops $S_1$ and $S_2$ for short-circuits without any additional expense for circuitry. This is achieved by using a self-conducting field-effect transistor, while the resistance circuits are so rated that on the interruption of one loop $S_1$ or $S_2$ the control voltage applied to the controlled system of the field effect transistor becomes at least approximately equal to zero, while when the loops $S_1$ and $S_2$ are not interrupted there is applied to the field effect transistor a voltage of one polarity blocking the transistor, and on the interruption of both the loops $S_1$ and $S_2$ a control voltage of opposite polarity which makes it conductive in the same manner as in the case of the interruption of only one loop $S_1$, $S_2$. Examples of central stations Z formed in this manner (FIG. 1) are shown in FIGS. 3, 4, 5, and 6.

FIG. 3 shows an example of embodiment which is particularly simple in respect of outlay for circuitry. Here each of the resistor circuits consists of a single resistor $R_1$, $R_2$ whose connection connected to the end of a loop $S_1$, $S_2$ remote from the voltage source G (FIG. 1) at the same time forms the circuit point *d* and *b* respectively from which the potential controlling the conductivity state of the self-conducting field-effect transistor $T_2$ is taken off; since in this case resistors corresponding to the resistors $R_{11}$, $R_{21}$ in FIG. 2 can be dispensed with, the circuit points *a, b,* and *c, d* respectively are identical.

The field-effect transistor $T_2$ used is advantageously, as shown in FIG. 3, a MOSFET, in which the control electrode is separated from the channel current path by a silicon oxide layer, thereby providing a low control current. The source electrode S is connected to the circuit point *b* and the drain electrode D is connected via the load resistor $R_L$ to the terminal 10.

The voltages occurring under the different operating conditions, particularly the control voltage $U_{db}$ in each case, can be seen in FIG. 3A. As shown, in the state of rest a control voltage $U_{db}$ prevails which is equal in amount to the feed voltage U but is negative, so that the field-effect transistor is non-conductive. On the interruption of a loop $S_1$ or $S_2$ and also in the event of a short-circuit the control voltage becomes equal to zero, so that through the use of a self-conducting field-effect transistor $T_2$ the latter becomes conductive and an indication and/or alarm signal is given. The field-effect transistor $T_2$ is also conductive on the interruption of both loops $S_1$ and $S_2$, since then the control voltage $U_{db}$ is positive and assumes the value of the feed voltage U.

In the table in FIG. 3A it is shown that the resistance value of the resistor $R_1$ is lower than that of the resistor $R_2$. This is due to the fact that when the field-effect transistor $T_2$ is conductive the resistor $R_1$ must carry its channel current, without thereby any appreciable increase in voltage occuring at the circuit point *b*, while only the control current, which is substantially smaller than the channel current, flows through the resistor $R_2$ when the loop $S_2$ is interrupted. As a rule it is convenient in all examples of embodiment for the resistance values of that resistance circuit to which the control electrode of the electronic switching element is connected to be higher by approximately one power of 10 than the resistance values of that resistance circuit to which a main electrode of the electronic switching element is connected. All the described forms of construction of the central station Z as illustrated in FIGS. 2, 3, 4, 5, and 6, can conveniently be used when the voltage supplied by the voltage source G is a low voltage, that is to say is below 24V, voltages of the order of 10V being particularly convenient. However, not all self-blocking field-effect transistors can be used for negative and positive control voltages of such values. In order to achieve the lowest possible current consumption in the state of rest it is also expedient for the resistance circuits connected in series with the loops $S_1$, $S_2$ to have the highest possible resistance. For this reason, for the additional monitoring of short-circuits when a self-conducting field-effect transistor is used it may also be convenient for the resistance circuits to be made in the form of two serially connected resistors on the model of FIG. 2. An embodiment of this kind is shown in FIG. 4.

From the table in FIG. 4A it can be seen that with the indicated rating of the resistors in the circuit arrangement shown in FIG. 4, namely with $R_{12} = 9\ R_{11}$ and $R_{22} = 9\ R_{21}$, the control voltage $U_{db}$, which is negative in the state of rest, is lower in amount than the feed voltage U. On interruption of a loop $S_1$, $S_2$ and in the event of a short-circuit the control voltage $U_{db}$ remains approximately equal to zero, with practically no change in relation to the table shown in FIG. 3A. With this circuit arrangement however it is not possible to prevent a control voltage $U_{db}$ equal to the feed voltage U from occurring on the interruption of both loops $S_1$, $S_2$.

In order to ensure in the circuit arrangement shown in FIG. 4 that the control voltage $U_{db}$ will be at least approximately equal to zero on the occurrence of an interruption, provision should be made in at least one resistance circuit for the resistance value of the resistor connected to the end of a loop $S_1$, $S_2$ remote from the voltage source G, that is to say the resistor $R_{11}$ and/or the resistor $R_{21}$, to be lower than the resistance value of the resistor connected to the voltage source G, that is to say the resistor $R_{12}$ or the resistor $R_{22}$. Here again the proportions of the resistance values of the two serially connected resistors $R_{11}$, $R_{12}$ or $R_{21}$, $R_{22}$ can be equal in both the resistance circuits, as has already been explained in connection with FIG. 2 and the table shown in FIG. 2B and as can be seen from the resistance ratios indicated in FIG. 4A.

A positive control voltage $U_{db}$ which is lower than the field voltage U on interruption of the two loops $S_1$, $S_2$, and, if desired, a reduction of the control voltage, which is negative in the state of rest, to a still greater extent than when the resistance circuits are in the form of series connections, can be achieved according to a further development by connecting an additional resistor between the two ends of at least one loop $S_1$, $S_2$. Although not illustrated, this measure may also be applied to the embodiment shown in FIGS. 2, 3, and 4. It will be explained below with reference to FIG. 5.

In FIG. 5 a resistor $R_{13}$ is connected to the two ends of the loop $S_1$ (FIG. 1) which are connected to the terminals 14, 16, since this resistor in turn is connected on the one hand to the terminal 14 and on the other hand via the circuit point *a* to the terminal 16. This additional resistor $R_{13}$ forms together with the resistors $R_{11}$, $R_{12}$ of the resistance circuit associated with the loop $S_1$ a voltage divider which comes into action on the interruption of the loop $S_1$, while when the loop $S_1$ is not interrupted the potential at the circuit point *b* of the resistance circuit is determined, as in the case of FIG. 4, by the resistance proportions of the resistors $R_{11}$, $R_{12}$. In corresponding manner a resistance $R_{23}$ is connected between the two ends of the loop $S_2$ which are connected to the terminals 18, 20, since this resistor is connected via the circuit point *c* to the terminal 18 and also to the terminal 20. This additional resistor $R_{23}$ is also out of action when the loop $S_2$ is not interrupted, but when the loop $S_2$ is interrupted it forms a voltage divider with the resistors $R_{21}$, $R_{22}$ of the resistance circuit associated with the loop $S_2$.

The resistance values of the additional resistors $R_{13}$, $R_{23}$ connected between the two ends of a loop $S_1$, $S_2$ are advantageously so selected that they are of the same order of magnitude as the total resistance value of the resistance circuit which is connected to the end of the same loop $S_1$, $S_2$ which is remote from the voltage source G (FIG. 1). This means that the resistance value of the additional resistor $R_{13}$ should be of the same order of magnitude as the sum of the resistance values of the resistors $R_{11}$ and $R_{12}$, and that the same relationship should exist between the additional resistors $R_{23}$ and the resistors $R_{21}$ and $R_{22}$. The following have been found to be particularly advantageous values of all resistances in relation to the control voltages $U_{db}$ occurring in the field-effect transistor $T_2$ under the different operating conditions and in relation to a low current consumption:

$R_{11} = 47$ kOhm, $R_{12} = R_{13} = 220$ kOhm, $R_{21} = R_{22} = 1$ MOhm, $R_{23} = 3.3$ MOhm.

The voltages occurring under the various operating conditions and shown in the table in FIG. 5A are obtained with the previously mentioned resistance values. It can be seen that the negative and positive values of the control voltage $U_{db}$ in the state of rest or in the interruption of the two loops $S_1$, $S_2$ are about one third of the feed voltage U, while in the event of a short-circuit and interruption of a loop $S_1$ and $S_2$ the control voltage $U_{db}$ is approximately equal to zero.

In the examples of embodiment described above it was assumed for the sake of simplicity that the voltage source G is short-circuit proof, so that in the event of a short-circuit between the two loops $S_1$, $S_2$ all the voltage considered in the last columns of the tables in FIGS. 2A, 3A, 4A, and 5A became zero in all cases. If however an indicating and/or alarm device is connected to the output of the electronic switching element it is convenient for this device also to be connected to the voltage source G provided. This can be done in accordance with FIG. 6, in which, as a modification of FIG. 5, a short-circuit current limiting resistor $R_K$ is provided, which is inserted between the end of the loop $S_1$ connected to the voltage source G and the resistors $R_{13}$, $R_{22}$ connected thereto, on the one hand, and one pole of the voltage source G on the other hand. The feed voltage U is thus also available at the terminal 10 in the event of a short-circuit between the loops $S_1$, $S_2$.

In all embodiments it is expedient for the electronic switching element to be connected, by its main electrode remote from the controlled system, directly and exclusively to the control electrode of an electronic amplifier element which follows in the circuit and whose control electrode input resistance thus forms the load resistance of the electronic switching element and thus makes it unnecessary to provide a separate ohmic load resistor. This measure is also adopted in the example of embodiment shown in FIG. 6, where the drain electrode D of the self-conducting field-effect transistor $T_2$ is connected directly and exclusively via the conductor 34 to the base $B_3$ of a NPN Transistor $T_3$, whose collector $C_3$ is connected to the terminal 10 and whose emitter $E_3$ is connected via a relay winding R to the terminal 12. In this arrangement the field-effect transistor $T_2$ acts as switch for the base current of the amplifier transistor $T_3$; in the event of a short-circuit or of an interruption in at least one loop $S_1$, $S_2$ the base current of the transistor $T_3$ becomes free to flow and makes the said transistor conductive, so that a current flows through the relay coil R, a relay contact K is closed, and a signal is given.

The resistance values of the resistors $R_{11}$, $R_{12}$, $R_{13}$, $R_{21}$, $R_{22}$, $R_{23}$ used in the example of embodiment shown in FIG. 6 may be the same as those in the example of embodiment of FIG. 5, so that under the different operating conditions the same voltages are obtained as those indicated in the table in FIG. 5A.

As shown by the resistance values mentioned for FIG. 5, the line resistances of the two loops $S_1$, $S_2$ will always be very low in relation to these values; even a loop resistance of the order of 1 kOhm will practically not change the voltage ratios. For the loops $S_1$, $S_2$ it is therefore possible to use very thin wire made of even alloys having less good conductivity, and the loop $S_1$, $S_2$ may have a considerable length. Even if the loop resistance should approximately achieve the order of magnitude of the resistances used in the central station Z, this can be taken into account by corresponding rating of the resistance circuits.

Whereas in the circuit arrangement shown in FIG. 1 the loops $S_1$, $S_2$ formed in separate cables 22, 24 are laid so as to be spatially separated from one another, for many applications it is convenient for the loops $S_1$, $S_2$ to lie spatially side by side, at least over the major part of their length. FIGS. 7 to 10 show examples of embodiment of this kind. In the embodiments shown in FIGS. 7 to 9, the loops $S_1$, $S_2$ are formed by two conductors of a cable, which in turn is laid in loop form and which starts from and returns to the central station Z (FIG. 1).

Figure 8:
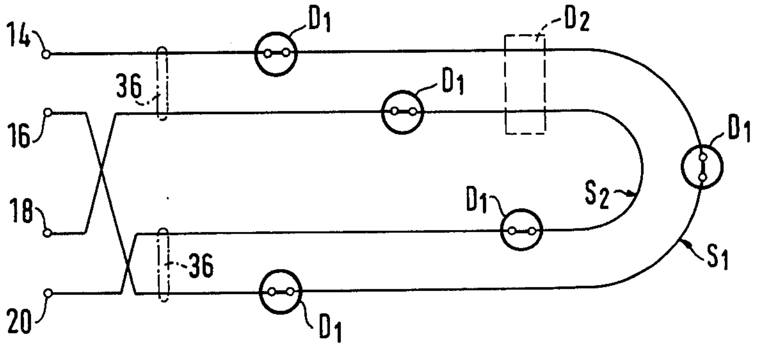

In all the circuit arrangements constructed according to the invention, and particularly when the central station Z (FIG. 1) is constructed in accordance with FIG. 2, the loop lay-out shown in FIGS. 7 and 8 can be used. The detectors $D_1$ previously described in connections with FIG. 1 can in this case be inserted in the loops $S_1$, $S_2$, but as a modification of the arrangement illustrated may also be dispensed with if only monitoring in respect of wire breakage is required. Furthermore, as shown in greater detail in FIG. 7 and as indicated in FIG. 8, it is possible to insert in the loops $S_1$, $S_2$ a detector $B_2$ which is provided with a double-throw switch and which in the non-responsive state shown in FIG. 7 leaves the closed-circuit currents in the loop $S_1$, $S_2$ unchanged, while in its responsive state it connects the loop connections together crosswise in pairs, so that then for example in FIG. 2 the voltage ratios at the circuit points *a, c,* are reversed.

In FIG. 7 the conductors of the cable 36 which form the loops $S_1$, $S_2$ are connected at the end of the cable which is at the top in the Figure to the terminals 14, 20 and thus in each case to one pole of the voltage source G (FIG. 1), while at the other end of the cable, which is at the bottom in the Figure, these conductors are connected to the terminals 16, 18 and thus in each case to a resistance circuit. In the case of direct current feeding, this results in opposite directions of the closed-circuit current in the loop $S_1$, $S_2$. In contrast thereto, in FIG. 8 the loops $S_1$, $S_2$ extend parallel in such a manner that the closed-circuit currents have the same directions. For this purpose one of the conductors of the cable 36 which form the loops $S_1$, $S_2$ is in each case connected to the terminal 14 or terminal 20 and thus to one pole of the voltage source G, and the other conductor is connected to the terminal 18 or 16 and thus to a resistance circuit.

Figure 9:
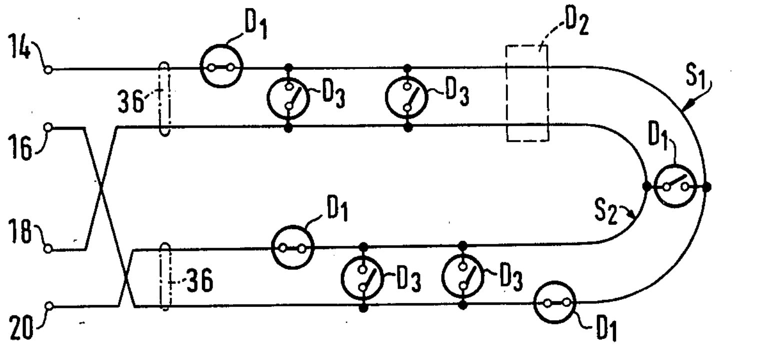

When in accordance with one of FIGS. 3, 4, 5, or 6 the central station Z is so constructed that the loops $S_1$, $S_2$ are also monitored in respect of short-circuit, as an advantageous further development the circuit arrangement may additionally be used to indicate or signal the response of detectors which are connected between the loops $S_1$, $S_2$ and which normally have a high internal resistance, but in the responsive state make a low-resistance connection between the loops, and in particular short-circuit them. FIG. 9 shows detectors $D_3$ of this kind, which are connected between the loops $S_1$, $S_2$, the arrangement of the loops $S_1$, $S_2$ being the same as in FIG. 8. In this arrangement, as shown in FIG. 9, the detectors $D_1$ and/or $D_2$ and also the detectors $D_3$ may be used side by side, while it is likewise possible to connect only detectors $D_3$ and to effect monitoring in respect of wire breakage, short-circuiting, and response of the detector $D_3$ by means of the circuit arrangement.

The arrangement of the loops $S_1$, $S_2$ explained in connection with FIG. 8 provides particular advantages when detectors $D_3$ are connected in accordance with FIG. 9. Firstly, in the event of a short-circuit or of the response of a detector $D_3$ the short-circuit resistance is always equal to the line resistance of a single loop $S_1$ or $S_2$ irrespective of the position of the short-circuit or of the detector $D_3$, so that this short-circuit resistance can be taken into account in a simple manner in the rating of the resistance circuit, even in the case of high values. Furthermore, the arrangement is particularly advantageous when the detectors $D_3$ are of the kind having a closed-circuit current consumption, for example ionisation firm alarms or photoelectric fire alarms having an electronic evaluation circuit. If a large number of such alarms are connected between the loops $S_1$, $S_2$ when these loops are arranged as shown in FIG. 7, the voltage available for supplying the detectors $D_3$ decreases with increasing distance from the terminals 14, 20, so that the operation of detectors $D_3$ at a great distance may be jeopardised. On the other hand, in the arrangement shown in FIG. 9 the supply voltage encounters the same flow paths, in respect of resistance values, through all the detectors $D_3$ which had not responded since these resistance values are always composed of the sum of the resistance of a loop $S_2$ or $S_3$ and the internal resistance of a detector $D_3$.

Figure 10:
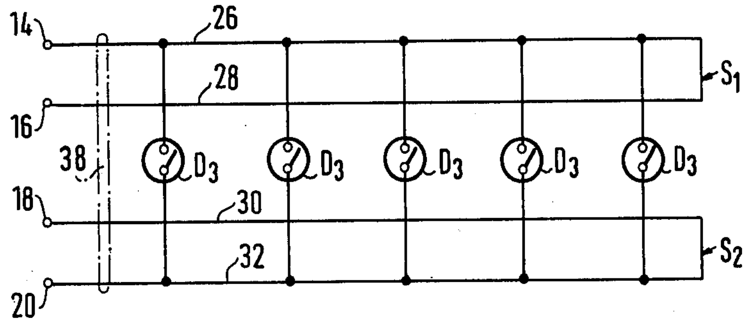

FIG. 10 shows a modification of the arrangement of the loops $S_1$, $S_2$ in comparison with FIG. 1, this modified arrangement being advantageous in cases where detectors $D_3$ of the kind explained in connection with FIG. 9 are connected between the loops $S_1$, $S_3$, where monitoring of the supply lines to the detectors $D_3$ in respect of wire breakage and short-circuiting is to be effected, and the central station Z (FIG. 1) is constructed in accordance with FIGS. 3, 4, 5, or 6. The detectors $D_3$ are here connected to the central station Z in accordance with the line system; all conductors 26, 28 and 30, 32 forming respectively the loops $S_1$ and $S_2$ lie in a single cable 38, while, as in FIG. 1 one loop $S_1$, $S_2$ is in each case formed by connecting together two conductors 26, 28 or 30, 32 at the end of the cable 38 remote from the central station Z (FIG. 1). In the case of closed-circuit current consumption by the detectors $D_3$ this arrangement provides the advantage that only the conductors 26, 32 need be designed for this closed-circuit current supply to the detectors $D_3$, while the other two conductors 28, 30 have to carry only the low closed-circuit current comparable with the closed-circuit current in FIGS. 1, 7, and 8, and therefore can be made thinner.

What is claimed is:

1. A circuit arrangement for monitoring interruptions of circuit continuity in each of two closed-circuit loops laid in at least one cable, one end of each loop being provided for connection to one pole of a voltage source, the other end of each loop being connected, via a respective resistance network to the other pole of the voltage source, the networks also deriving potentials for controlling an electronic switching element, which potentials are derived in the event of an interruption in at least one of said loops, and the electronic switching element having its control signal path connected between points in the resistance networks from which said control potentials are derived thereby to derive a signal indicative of interruptions of circuit continuity.

2. A circuit arrangement for monitoring interruptions of the continuity of each of two closed-circuit loops laid in at least one cable, each closed-circuit loop having two ends, comprising:

A. a voltage source having two poles,

B. means for electrically connecting one end of each loop to a corresponding one of the poles;

C. resistance network means for connecting the other end of each loop to another corresponding one of the poles and for deriving two control potentials, at least one of which varies when continuity of at least one of the two loops is broken, and D. an electronic switching element responsive to and controlled by the control potentials for developing an indication signal whenever the continuity of at least one of the loops is broken.

3. An arrangement according to claim 2, wherein the electronic switching element is a transistor.

4. An arrangement according to claim 3, wherein the transistor is a field-effect transistor.

5. An arrangement according to claim 2 wherein the voltage source is an alternating-voltage source.

6. An arrangement according to claim 2 wherein the voltage source is a direct-current source.

7. An arrangement according to claim 2 wherein the voltage source provides a voltage of the order of 10 V.

8. An arrangement according to claim 2 wherein the control potentials are selected so that when the loops are not interrupted, the switching element is non-conductive.

9. An arrangement according to claim 8 wherein the switching element is a field-effect transistor and the resistance networks are rated so that with an interruption in one of said loops, the control voltage applied to the field-effect transistor is approximately zero, the field-effect transistor is self-conducting, and its conductive state serves additionally to monitor the loops to detect short-circuiting.

10. An arrangement according to claim 9 wherein each of the resistance networks consists of a single resistor whose connection at the end of one of said loops remote from the voltage source forms the point at which the potential controlling the state of conductivity of the self-conducting field-effect transistor is derived.

11. An arrangement according to claim 9 wherein in at least one of said resistance networks the resistance value of a resistance connected to the end of one of said loops remote from the voltage source is lower than the resistance value of a resistor connected to the voltage source.

12. An arrangement according to claim 9 wherein the values of resistances in the resistance network to which the control electrode of the field-effect transistor is connected are higher by approximately a power of ten than the values of resistances in the resistance network to which a main electrode of the field-effect transistor is connected.

13. An arrangement according to claim 9 wherein an additional resistor is connected between the ends of at least one of said loops.

14. An arrangement according to claim 13 wherein the resistance value of the additional resistor is of the same order of magnitude as the total resistance value of the resistance network which is connected to the end of the same loop which is remote from the voltage source connection.

15. An arrangement according to claim 9 wherein the field-effect transistor has an insulated control electrode.

16. An arrangement according to claim 2 wherein the control potentials are selected so that when the loops are not interrupted, the difference in control potentials as applied to the electronic switching element is approximately zero.

17. An arrangement according to claim 2 wherein each of the resistance networks consists of two serially connected resistors whose common connection point in each case forms the point from which the respective control potentials are derived.

18. An arrangement according to claim 17 wherein the ratio of the values of the resistances in each respective network is approximately the same.

19. An arrangement according to claim 18 wherein the values of the resistances are approximately the same.

20. An arrangement according to claim 2 wherein a short-circuit limiting resistor is inserted between the end of one of the said loops and a connection point for the voltage source.

21. An arrangement according to claim 2 wherein the electronic switching element is connected to the voltage source in series with a load resistor.

22. An arrangement according to claim 21 wherein the load resistor is formed at least partly by an indicator element.

23. An arrangement according to claim 22 wherein the voltage drop across the load resistor controls an indicator device in the circuit.

24. An arrangement according to claim 21 wherein the electronic switching element is connected to the control electrode of an electronic amplifying element in the circuit.

25. An arrangement according to claim 24 wherein the amplifier element is a transistor.

26. An arrangement according to claim 25 wherein the transistor is of the PNP type.

27. An arrangement according to claim 2 wherein detectors provided with normally closed contacts which open in response to an alarm condition are inserted in the loops.

28. An arrangement according to claim 27, wherein the loops extend spatially side by side at least over the major part of their length.

29. An arrangement according to claim 28 wherein the loops are formed by conductors of a cable laid as a loop.

30. An arrangement according to claim 29 wherein a detector having a double-throw switch is inserted in the loops, said detector leaving the closed-circuit currents unchanged when it has not been operated and connecting the loop connections together crosswise in pairs when it has been operated.

31. An arrangement according to claim 29 wherein the conductors of the cable which form the loops have one end connected to one pole of the voltage source and the other end connected to another pole via the respective resistance network.

32. An arrangement according to claim 29 wherein one of the conductors of the cable in each loop is connected to a pole of the voltage source and the other conductor in each loop is connected to another pole via the respective resistance network.

33. An arrangement according to claim 28 wherein at least one detector, which connects the loops together after it has been operated, is inserted between the loops.

34. An arrangement according to claim 33 wherein the conductive state of the self-conducting field-effect transistor additionally serves to signal the response of the detector which connects the loops when it has been operated.

35. An arrangement according to claim 34 wherein the detector, which connects the loops together after it has been operated, is inserted between those conductors forming the loops of the cable which are connected to one pole of the voltage source.

36. An arrangement according to claim 2 wherein the loops are so disposed as to be spatially separated from one another.

37. An arrangement according to claim 2 wherein the loops are each formed by two conductors of a cable, said conductors being connected together at the end of the cable.

38. An arrangement according to claim 37 wherein both loops are formed by conductors of the same cable.

* * * * *